United States Patent
Tang et al.

(10) Patent No.: US 11,320,920 B2
(45) Date of Patent: May 3, 2022

(54) TOUCH DISPLAY PANEL AND A TOUCH CONTROL CIRCUIT

(71) Applicant: Novatek Microelectronics Corp., Hsinchu (TW)

(72) Inventors: Yu-Ying Tang, Taoyuan (TW); Chih-Chang Lai, Taichung (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 16/853,763

(22) Filed: Apr. 21, 2020

(65) Prior Publication Data

US 2020/0348785 A1 Nov. 5, 2020

Related U.S. Application Data

(60) Provisional application No. 62/840,396, filed on Apr. 30, 2019.

(51) Int. Cl.
*G06F 3/041* (2006.01)
*H01L 27/32* (2006.01)
(Continued)

(52) U.S. Cl.
CPC ........ *G06F 3/0412* (2013.01); *G02F 1/13338* (2013.01); *G06F 3/0445* (2019.05); *G06F 3/04184* (2019.05); *H01L 27/323* (2013.01)

(58) Field of Classification Search
CPC .... G06F 3/0412; G06F 3/0443; G06F 3/0446; G06F 2203/04103; G06F 3/04164;
(Continued)

(56) References Cited

U.S. PATENT DOCUMENTS 9,268,447 B2 2/2016 Hu
9,740,355 B2 8/2017 Li et al.
(Continued)

FOREIGN PATENT DOCUMENTS

CN 104699355 6/2015
CN 106662940 5/2017
(Continued)

OTHER PUBLICATIONS

"Office Action of Taiwan Counterpart Application", dated Apr. 23, 2021, p. 1-p. 28.
(Continued)

*Primary Examiner* — Sanjiv D. Patel
(74) *Attorney, Agent, or Firm* — JCIPRNET

(57) ABSTRACT

A touch display panel including a substrate, a first touch sensor layer and a display electrode layer is provided. The first touch sensor layer is disposed on the substrate and patternized into a plurality of blocks for serving as a plurality of first touch sensor electrodes. The first touch sensor electrodes are grouped into a plurality of touch sensor units. Each touch sensor unit includes one or more first touch sensor electrodes. At least one first touch sensor electrode of each touch sensor unit serves as a transmitting electrode during a touch sensing period. The display electrode layer is disposed between the substrate and the first touch sensor layer and patternized into a plurality of blocks for serving as a plurality of display electrodes. The display electrodes are grouped into a plurality of display units. Each display unit includes one or more display electrodes. Each display unit is respectively corresponding to a touch sensor unit of the plurality of touch sensor units.

38 Claims, 20 Drawing Sheets

(51) Int. Cl.
*G06F 3/044* (2006.01)
*G02F 1/1333* (2006.01)

(58) Field of Classification Search
CPC .... G06F 3/044; G06F 3/0445; G06F 3/03547; G06F 3/04182; G06F 3/04184; H01L 27/323
See application file for complete search history.

(56) References Cited

U.S. PATENT DOCUMENTS

| | | | |
|---|---|---|---|
| 10,268,297 | B2 | 4/2019 | Lee et al. |
| 10,365,743 | B2 | 7/2019 | Pan et al. |
| 10,585,516 | B2 | 3/2020 | Cheng et al. |
| 10,976,854 | B2 | 4/2021 | Guo et al. |
| 2015/0022497 | A1* | 1/2015 | Chang ................ G02F 1/13306 345/174 |
| 2016/0259443 | A1* | 9/2016 | Yang .................. G06F 3/04164 |
| 2016/0291726 | A1* | 10/2016 | Li ........................ G06F 3/0443 |
| 2017/0083127 | A1* | 3/2017 | Liu ...................... G06F 3/0443 |
| 2017/0123541 | A1* | 5/2017 | Omata .................... G06F 3/044 |
| 2017/0192581 | A1* | 7/2017 | Shamarao ............ G06F 3/04166 |
| 2018/0039364 | A1* | 2/2018 | Pan ......................... H01L 24/06 |
| 2018/0239488 | A1* | 8/2018 | Lin ..................... G06F 3/04166 |
| 2018/0321778 | A1* | 11/2018 | Lee ....................... G06F 3/0446 |
| 2018/0329573 | A1* | 11/2018 | Liu ....................... G06F 3/0446 |
| 2019/0050075 | A1* | 2/2019 | Reynolds .............. G06F 1/3262 |
| 2019/0163307 | A1* | 5/2019 | Cheng ................ G06F 3/04184 |
| 2019/0361559 | A1* | 11/2019 | Guo ..................... G06F 3/0414 |

FOREIGN PATENT DOCUMENTS

| | | |
|---|---|---|
| CN | 107016960 | 8/2017 |
| CN | 107154218 | 9/2017 |
| CN | 107491215 | 12/2017 |
| CN | 108459755 | 8/2018 |
| CN | 109164935 | 1/2019 |
| TW | 201443730 | 11/2014 |
| TW | 201843571 | 12/2018 |

OTHER PUBLICATIONS

"Office Action of Taiwan Counterpart Application", dated Sep. 17, 2021, p. 1-p. 16.

* cited by examiner

TOUCH DISPLAY PANEL AND A TOUCH CONTROL CIRCUIT

CROSS-REFERENCE TO RELATED APPLICATION

This application claims the priority benefit of U.S. Provisional application Ser. No. 62/840,396, filed on Apr. 30, 2019. The entirety of the above-mentioned patent application is hereby incorporated by reference herein and made a part of this specification.

BACKGROUND

Technical Field

The disclosure is directed to a touch display panel and a touch control circuit configured to drive the touch display panel.

Description of Related Art

Current development trends provide lighter and thinner display panels. Following these trends, substrate and packaging layer of display panels are also becoming thinner.

An example of touch displays panels is the organic light-emitting diode (OLED) on-cell touch display panel. It is possible to provide very thin packaging layers for OLED on-cell touch display panel, where the layers are ≤10 um.

Another example of touch display panels is the liquid crystal display (LCD) on-cell color filter (CF) glass panel. The thickness of conventional on-cell CF glass is 150 um~200 um. However, the LCD on-cell CF glass is also becoming thinner. Other materials are being used to substitute CF glass and produce thinner display panels.

Thus, OLED on-cell touch display panels and LCD on-cell CF glass touch display panels are much thinner than conventional LCD out-cell touch display panels. However, parasitic capacitance is inversely proportional to the distance between the touch sensors and the display electrodes of a touch display panel. Thus, thinner touch display panels have much higher parasitic capacitance. Due to the higher parasitic capacitance, higher output power is required to drive the on-cell touch display panel.

SUMMARY OF THE DISCLOSURE

Accordingly, to address the above described difficulty, the disclosure provides a touch control circuit configured to control a touch display panel. The touch display panel includes a plurality of touch sensor electrodes and a plurality of display electrodes. The touch control circuit drives the touch display panel to perform a touch sensing method.

In one of the embodiments, the disclosure is directed to a touch display panel. The touch display panel includes a substrate; a first touch sensor layer and a display electrode layer. The first touch sensor layer is disposed on the substrate and patternized into a plurality of blocks for serving as a plurality of first touch sensor electrodes. The first touch sensor electrodes are grouped into a plurality of touch sensor units. Each touch sensor unit includes one or more first touch sensor electrodes. At least one first touch sensor electrode of each touch sensor unit is configured to serve as a transmitting electrode during a touch sensing period. The display electrode layer is disposed between the substrate and the first touch sensor layer and patternized into a plurality of blocks for serving as a plurality of display electrodes. The display electrodes are grouped into a plurality of display units. Each display unit includes one or more display electrodes. Each display unit is respectively corresponding to a touch sensor unit of the plurality of touch sensor units.

In one of the embodiments, the disclosure is directed to a touch control circuit configured to control a touch display panel. The touch display panel includes a substrate, a first touch sensor layer, and a display electrode layer. The first touch sensor layer is disposed on the substrate and patternized into a plurality of blocks for serving as a plurality of first touch sensor electrodes. The first touch sensor electrodes are grouped into a plurality of touch sensor units. Each touch sensor unit includes one or more first touch sensor electrodes. The display electrode layer is disposed between the substrate and the touch sensor layer and serves as one or more display electrodes. The touch display panel further includes a plurality of display pixels. Each display pixel includes at least one organic light-emitting diode. The organic light-emitting diode has a first end and a second end. At least one of the first end and the second end is formed by one of the one or more display electrodes. The touch control circuit includes a first control circuit and a second control circuit. The first control circuit is configured to provide a first driving signal to at least one of the one or more first touch sensor electrodes of each touch sensor unit. The at least one of the one or more first touch sensor electrodes is configured to serve as a transmitting electrode during a touch sensing period. The second control circuit is configured to set at least one of the one or more display electrodes in a state capable of reducing effect of parasitic capacitances between the currently-driven-for-sensing touch sensor unit and at least one of the one or more display electrodes.

The display electrode layer can be patternized into a plurality of blocks for serving as a plurality of display electrodes. The display electrodes are grouped into a plurality of display units. Each display unit can include one or more display electrodes. Each display unit can be respectively corresponding to a touch sensor unit of the plurality of touch sensor units.

To make the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
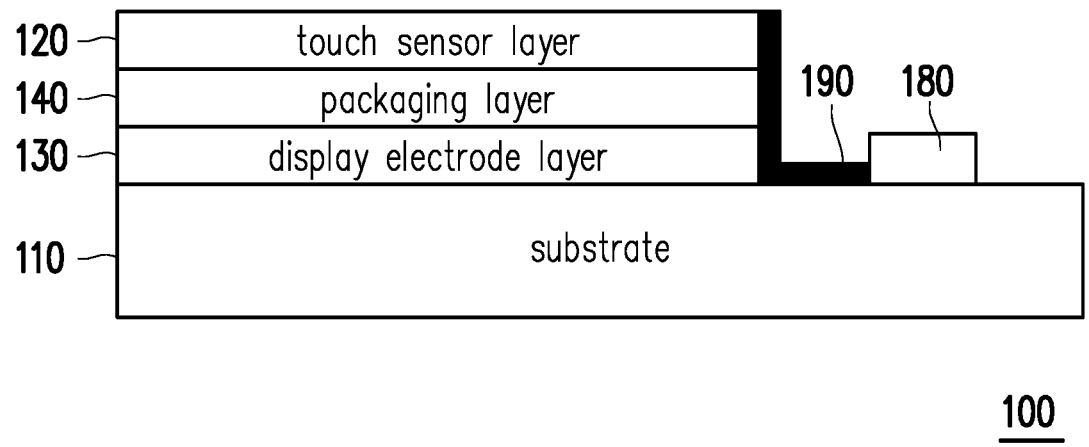
FIG. 1 is a schematic diagram illustrating a touch display panel and a touch control circuit according to an embodiment of the disclosure.

It is to be understood that other embodiments may be utilized and structural changes may be made without departing from the scope of the present disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected", "coupled", and variations thereof herein are used broadly and encompass direct and indirect connections and couplings.

Reference will now be made in detail to the present exemplary embodiments of the disclosure, examples of which are illustrated in the accompanying drawings. Wherever possible, the same reference numbers are used in the drawings and the description to refer to the same or like parts.

FIG. 1 is a schematic diagram illustrating a touch display panel and a touch control circuit according to an embodiment of the disclosure. FIG. 1 illustrates the touch display panel 100 and the touch control circuit 180. The touch display panel 100 may include a substrate 110, a touch sensor layer 120 (first touch sensor layer), a display electrode layer 130 and a packaging layer 140. The touch sensor layer 120 may be disposed on the substrate 110. The display electrode layer 130 may be disposed between the substrate 110 and the touch sensor layer 120. The packaging layer 140 may be disposed between the touch sensor layer 120 and the display electrode layer 130. The touch control circuit 180 may be disposed on the substrate 110. The touch control circuit 180 may be configured to control the touch display panel 100. The trace 190 may connect the touch control circuit 180 to the touch sensor layer 120 and the display electrode layer 130.

Figure 2:
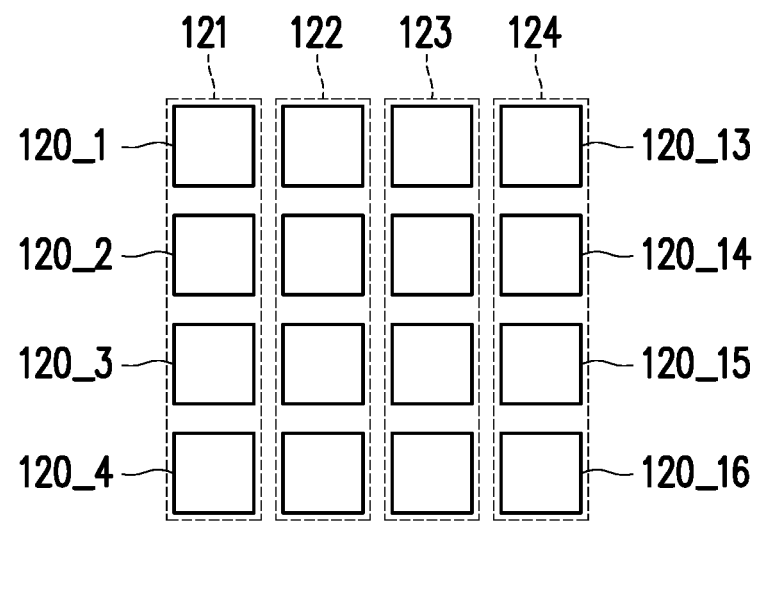
FIG. 2 illustrates a plurality of touch sensor electrodes included in the touch sensor layer according to an embodiment of the disclosure.
Figure 3:
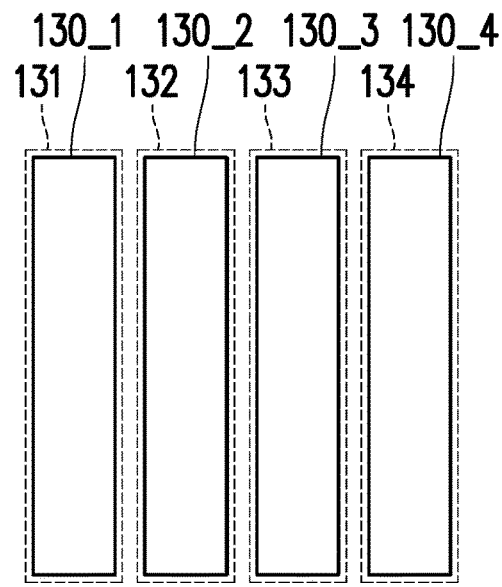
FIG. 3 illustrates a plurality of display electrodes included in the display electrode layer according to an embodiment of the disclosure.

The touch sensor layer 120 and the display electrode layer 130 may respectively include a plurality of first touch sensor electrodes and a plurality of display electrodes as illustrated in FIG. 2 and FIG. 3, for example.

FIG. 2 illustrates a plurality of touch sensor electrodes included in the touch sensor layer according to an embodiment of the disclosure. The touch sensor layer 120 may be patternized into a plurality of blocks for serving as a plurality of first touch sensor electrodes 120_1~120_16. The first touch sensor electrodes 120_1~120_16 may be grouped into a plurality of touch sensor units 121~124. Each touch sensor unit 121~124 may include one or more first touch sensor electrodes 120_1~120_16. In the example of FIG. 2, the touch sensor unit 121 may include the touch sensor electrodes 120_1, 120_2, 120_3 and 120_4. The touch sensor unit 124 may include the touch sensor electrodes 120_13, 120_14, 120_15 and 120_16. The touch sensor electrodes that the touch sensor unit 122 and the touch sensor unit 123 respectively include can be deduced by analogy.

FIG. 3 illustrates a plurality of display electrodes included in the display electrode layer according to an embodiment of the disclosure. The display electrode layer 130 may be patternized into a plurality of blocks for serving as a plurality of display electrodes 130_1~130_4. The display electrodes 130_1~130_4 may be grouped into a plurality of display units 131~134. Each display unit 131~134 may include one or more display electrodes 130_1~130_4. In the example of FIG. 3, the display unit 131 may include the display electrode 130_1. The display unit 132 may include display the electrode 130_2. The display unit 133 may include the display electrode 130_3. The display unit 134 may include the display electrode 130_4. In the present embodiment, an area of each touch sensor unit 121~124 can be substantially smaller than or equal to an area of the corresponding display unit 131~134 as illustrated in FIG. 2 and FIG. 3.

In the present embodiment, each display unit 131~134 may respectively correspond to a touch sensor unit 121~124 of the plurality of touch sensor units. Each display unit 131~134 may be located below one of the touch sensor units 121~124. For example, the display unit 131 may be located below the touch sensor unit 121. The display unit 132 may be located below the touch sensor unit 122. The display unit 133 may be located below the touch sensor unit 123. The display unit 134 may be located below touch sensor unit 124. In other words, each of the touch sensor units 121~124 may be located above the corresponding display electrode 130_1~130_4. For example, the touch sensor unit 121 may be located above the corresponding display electrode 130_1. The touch sensor unit 122 may be located above the corresponding display electrode 130_2. The touch sensor unit 123 may be located above the corresponding display electrode 130_3. The touch sensor unit 124 may be located above the corresponding display electrode 130_4. Thus, each display unit 131~134 may respectively correspond to a touch sensor unit 121~124 of the plurality of touch sensor units.

In the present embodiment, each of the touch sensor units 121~124 may include a first number of the first touch sensor electrodes 120_1~120_16, and each of the corresponding display units 131~134 may include a second number of the display electrodes 130_1~130_4. The second number may be unequal to the first number. For example, FIG. 2 shows that each of the touch sensor units 121~124 may respectively include four first touch sensor electrodes, and FIG. 3 shows that the display units 131~134 may respectively include one display electrode, where the first number is 4 and the second number is 1. The second number is unequal to the first number, and the first number can be greater than the second number. However, the examples of FIG. 2 and FIG. 3 do not intend to limit the disclosure. Moreover, in the present embodiment, a respective area of each first touch sensor electrode 120_1~120_16 of each touch sensor unit 121~124 may be smaller than or equal to a respective area of each display electrode 130_1~130_4 of each display unit 131~134.

In an embodiment, the second number of the display electrodes 130_1~130_4 that each of the corresponding display units 131~134 includes may be equal to the first number of the first touch sensor electrodes 120_1~120_16 that each of the touch sensor units 121~124 includes.

In the embodiment, each display unit is illustrated to have a single display electrode, but in other embodiments, each display unit can have multiple display electrodes. In the present embodiment, an area of each touch sensor unit 121~124 is substantially equal to or smaller an area of the corresponding display unit 131~134 as illustrated in FIG. 2 and FIG. 3. In other embodiments, an area of each touch sensor unit may be larger to an area of the corresponding display unit. In addition, the corresponding relationship between the touch sensor units and display units may not be limited to one-to-one relationship, and may be one-to-multiple or multiple-to-one relationship. This means that the same touch sensor unit may corresponding to different display units, or different touch sensor units may corresponding to the same display unit.

Figure 4:
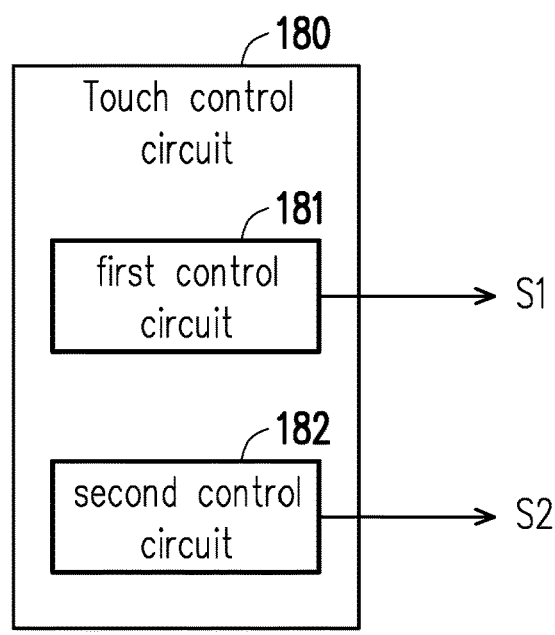
FIG. 4 is a schematic diagram illustrating a touch control circuit according to an embodiment of the disclosure.

FIG. 4 is a schematic diagram illustrating a touch control circuit according to an embodiment of the disclosure. The touch control circuit 180 may include a first control circuit 181 and a second control circuit 182. At least one of the one or more first touch sensor electrodes 120_1~120_16 of each touch sensor unit 121~124 is configured to serve as a transmitting electrode during a touch sensing period. The first control circuit 181 may be configured to provide (directly output or generating at least one control signal used for generating) a first driving signal S to the at least one of the one or more first touch sensor electrodes 120_1~120_16 of each touch sensor unit 121~124. The second control circuit 182 may be configured to set each of the one or more display electrodes 130_1~130_4 of the display unit 131~134 corresponding to a currently-driven-for-sensing touch sensor unit in a state capable of reducing effect of parasitic capacitances between the currently-driven-for-sensing touch sensor unit and the corresponding display unit.

In the present embodiment, the state capable of reducing effect of parasitic capacitances may be a synchronization state or a floating state. In the synchronization state, the second control circuit 182 may be configured to provide (directly output or generating at least one control signal used for generating) a synchronization signal S2 to each of the one or more display electrodes 130_1~130_4 of the display unit 131~134 corresponding to a currently-driven-for-sensing touch sensor unit. Further description about parasitic capacitances is provided with other embodiments of the disclosure.

The synchronization signal S2 may be directly provided by a single semiconductor chip that can drive and control the display panel 100 to perform at least one of the display operation, the touch sensing operation and the fingerprint sensing operation. This means that the single semiconductor chip may directly output the synchronization signal S2; or alternatively, the single semiconductor chip can generate at least one control signal used by another circuit for generating and outputting the synchronization signal S2. Alternatively, the synchronization signal S2 may be provided by a touch IC (integrated circuit) and transmitted to a display IC, and the display IC provides the synchronization signal S2 to each of the one or more display electrodes. This means that the touch IC may directly output the synchronization signal S2 to the display IC; or alternatively, the touch IC can generate at least one control signal to be used by another circuit (for example, the display IC or another circuit) which can then generate the synchronization signal S2 according to the at least one control signal.

It is noted that in some embodiments, each of the one or more display electrodes of the display unit corresponding to at least one currently-not-driven-for-sensing touch sensor unit can be further set in the synchronization state. This means that for a part or all of the other touch sensors that currently are not being driven for touch sensing, each of the one or more display electrodes of the corresponding display units can be further set in the synchronization state, by providing the same or a different synchronization signal. In some other embodiments, each of the one or more display electrodes of the display unit corresponding to at least one currently-not-driven-for-sensing touch sensor unit can be further set in a floating state. This means that for a part or all of the other touch sensors that currently are not being driven for touch sensing, each of the one or more display electrodes of the corresponding display units can be further set in the floating state.

Regarding hardware structures of the components in the embodiment of FIG. 4, the first control circuit 181 and the second control circuit 182 may be a processor having computational capability. Alternatively, the first control circuit 181 and the second control circuit 182 may be designed through hardware description languages (HDL) or any other design methods for digital circuits familiar to people skilled in the art and may be hardware circuits implemented through a field programmable gate array (FPGA), a complex programmable logic device (CPLD), or an application-specific integrated circuit (ASIC). In addition, enough teaching, suggestion, and implementation illustration for hardware structures of the first control circuit 181 and the second control circuit 182 can be obtained with reference to common knowledge in the related art, which is not repeated hereinafter.

Figure 5:
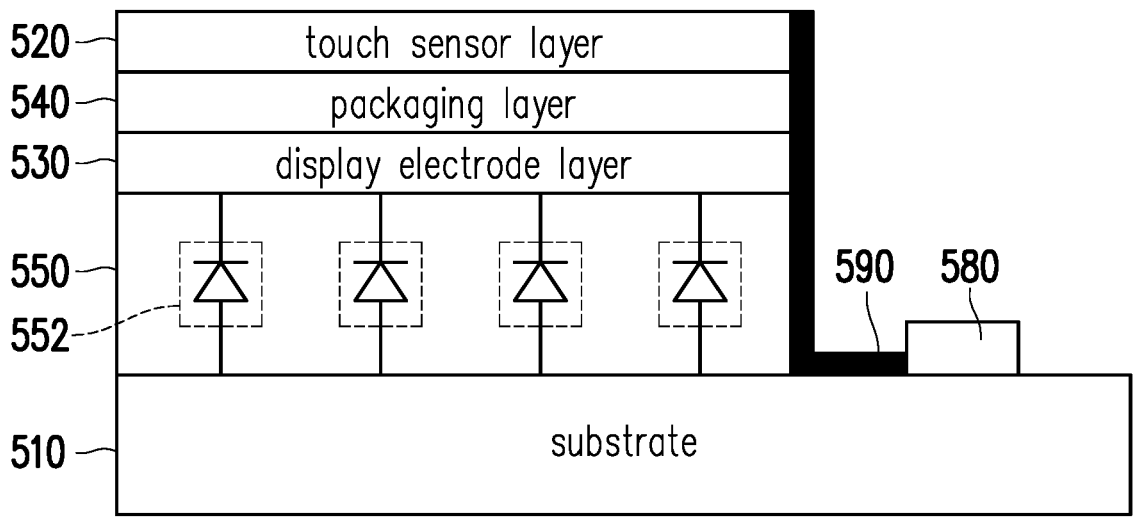
FIG. 5 is a schematic diagram illustrating an organic light-emitting diode (OLED) panel and a touch control circuit according to an embodiment of the disclosure.

FIG. 5 is a schematic diagram illustrating an organic light-emitting diode (OLED) panel and a touch control circuit according to an embodiment of the disclosure. FIG. 5 illustrates the OLED panel 500 and the touch control circuit 580. The OLED panel 500 may include a substrate 510, a touch sensor layer 520, a display electrode layer 530, a packaging layer 540, a pixel layer 550 and a trace 590. Description of these elements of FIG. 5 is similar to the elements of FIGS. 1-4.

The OLED panel 500 may include a plurality of display pixels 552 located in the pixel layer 550. The pixel layer 550 is disposed between the substrate 510 and the display electrode layer 530. Each display pixel 552 may include at least one OLED. Each of the OLEDs may have a first end and a second end, for example, an anode end and a cathode end, and at least one of the first end and the second end, for example, the cathode end, may be formed by one of the display electrodes of the display electrode layer 530. In the present embodiment, the touch display panel 500 is an OLED panel and further includes a plurality of OLEDs, and the display electrode layer can be an OLED cathode layer of the OLEDs.

Figure 6:
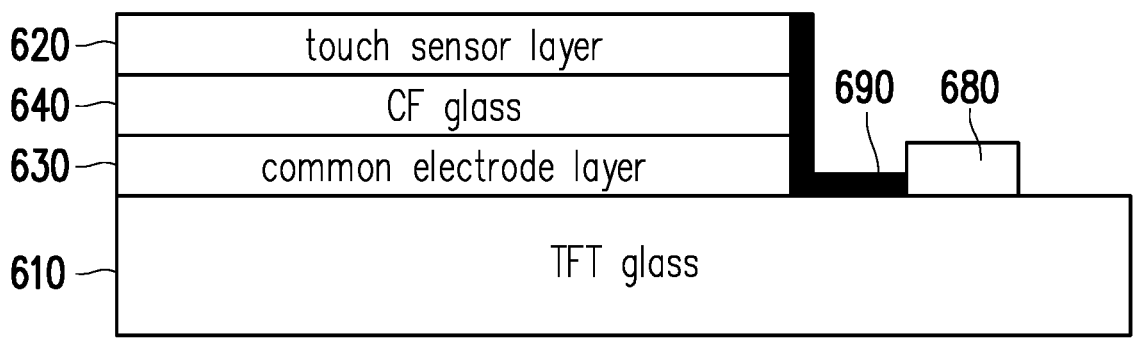
FIG. 6 is a schematic diagram illustrating a liquid crystal display (LCD) touch display panel and a touch control circuit according to an embodiment of the disclosure.

FIG. 6 is a schematic diagram illustrating a liquid crystal display (LCD) touch display panel and a touch control circuit according to an embodiment of the disclosure. FIG. 6 illustrates a LCD panel 600 and a touch control circuit 680. The LCD panel 600 may include a thin-film transistor (TFT) glass 610, a touch sensor layer 620, a common electrode layer (display electrode layer) 630 and a color filter (CF) glass 640. The touch sensor layer 620 may be disposed on the TFT glass 610. The common electrode layer 630 may be disposed between the TFT glass 610 and the touch sensor layer 620. The CF glass 640 may be disposed between the touch sensor layer 620 and the common electrode layer 630. The touch control circuit 680 may be disposed on the TFT glass 610. The touch control circuit 680 may be configured to control the operation of the LCD panel 600. The trace 690 may connect the touch control circuit 680 to the touch sensor layer 620 and the common electrode layer 630. In the present embodiment, the touch display panel 600 is a LCD panel and further includes a plurality of common electrodes served as the display electrode layer.

The touch sensor layer 620 and the common electrode layer 630 is similar to the touch sensor layer 120 and the display electrode layer 130 of FIG. 1. Description of the touch sensor layer 620 and the common electrode layer 630 may be found in the description of FIGS. 1-4.

Figure 7A:
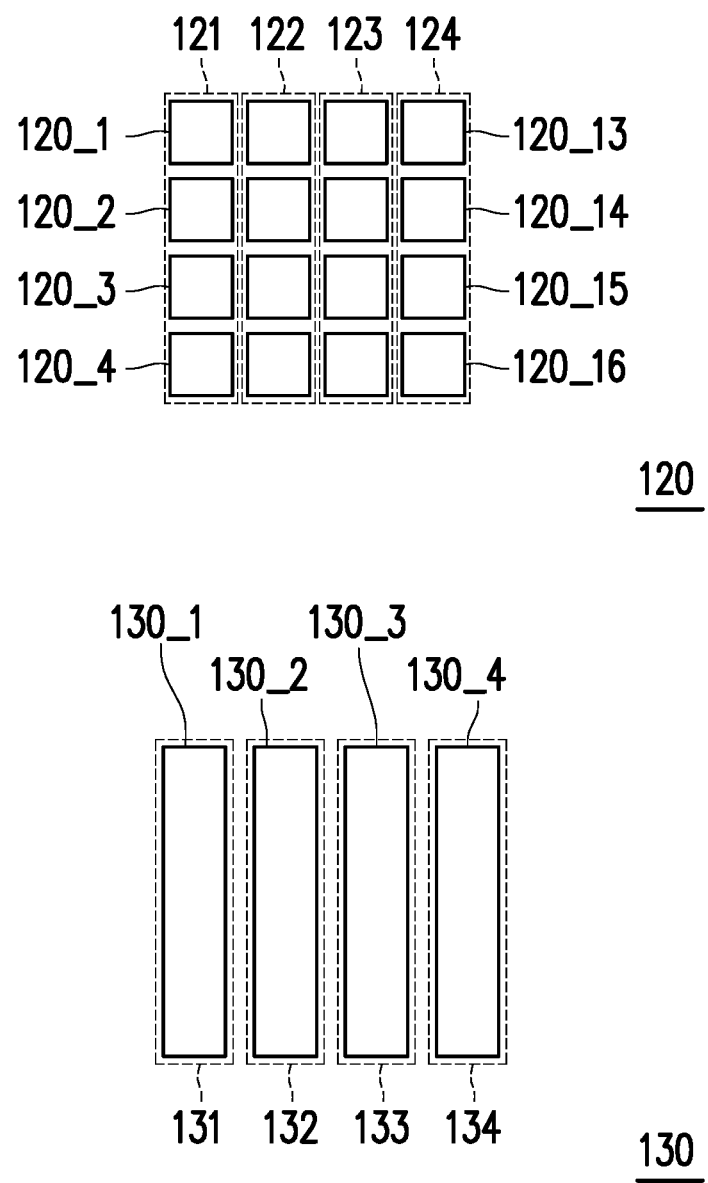
FIG. 7A and FIG. 7B are schematic diagrams illustrating a plurality of touch sensor electrodes and a plurality of display electrodes controlled to reduce effect of parasitic capacitances according to an embodiment of the disclosure.
Figure 7B:
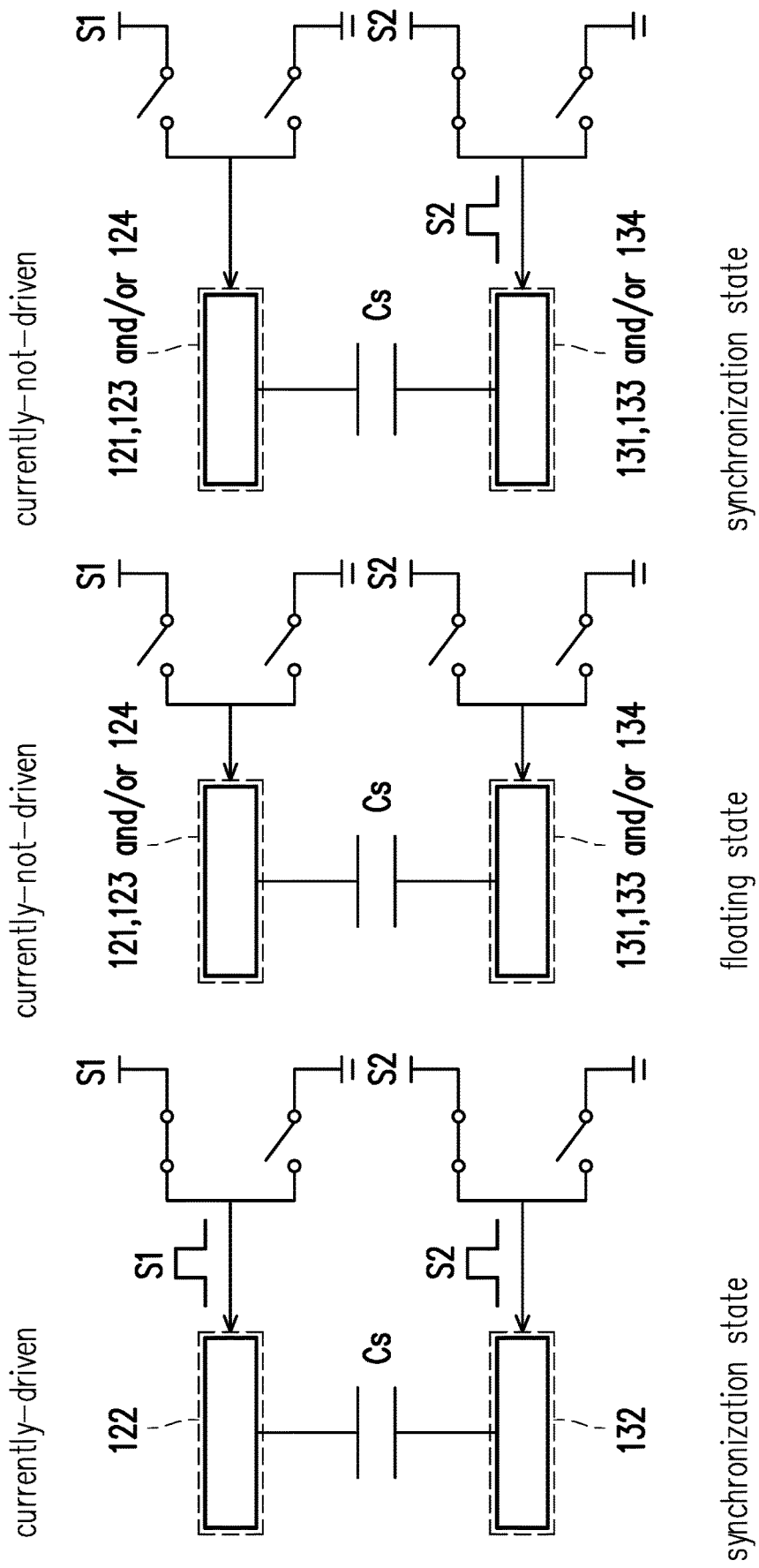

FIG. 7A and FIG. 7B are schematic diagrams illustrating a plurality of touch sensor electrodes and a plurality of display electrodes driven to reduce effect of parasitic capacitances according to an embodiment of the disclosure. The plurality of touch sensor electrodes 120_1~120_16 and the plurality of display electrodes 130_1~130_4 are illustrated in FIG. 7.

For example, the touch sensor layer 120 includes the plurality of touch sensor electrodes 120_1~120_16, and the display electrode layer 130 includes the plurality of display electrodes 130_1~130_4. In FIG. 7A, the display electrodes 130_1~130_4 may be located below the touch sensor electrodes 120_1~120_16. A parasitic capacitance Cs may be generated between a touch sensor electrode 120_1~120_16 and a display electrode 130_1~130_4.

The touch sensor electrodes 120_1~120_16 may be grouped into a plurality of touch sensor units. The display electrodes 130_1~130_4 may be grouped into a plurality of display units. FIG. 7A shows the touch sensor unit 122 and the display unit 132. As previously described for FIGS. 2-4, the first control circuit 181 may provide (directly output or generating at least one control signal used for generating) a first driving signal S sequentially to the touch sensor units. Therefore, the first control circuit 181 may provide (directly output or generating at least one control signal used for generating) the first driving signal S1 to at least one touch sensor electrode of a currently-driven-for-sensing touch sensor unit. The second control circuit 182 may set each of the display electrodes of a display unit to a state capable of reducing effect of parasitic capacitances between the currently-driven-for-sensing touch sensor unit and the corresponding display unit. In the example of FIG. 7B, the touch sensor unit 122 is exemplarily shown as the currently-driven-for-sensing touch sensor unit. The first control circuit 181 may currently provide the first driving signal S1 to the touch sensor electrodes 120_5~120_8 of touch sensor unit 122 to perform touch sensing by the touch sensor unit 122.

The display unit 132 may be located below the currently-driven-for-sensing touch sensor unit 122 to cause greater effect of parasitic capacitance compared to the other display units. Thus, display unit 132 may be arranged as the display unit corresponding to the currently-driven-for-sensing touch sensor unit 122. In order to reduce effect of parasitic capacitances like Cs, the second control circuit 182 may be configured to set the display electrode 130_2 of the display unit 132 in a synchronization state. The second control circuit 182 may drive the display electrode 130_2 of the display unit 132 with a synchronization signal S2 in the synchronization state.

FIG. 7B shows that a voltage between the first driving signal S1 and the synchronization signal S2 can be substantially constant (zero or non-zero) to reduce effect of parasitic capacitances. The first driving signal S1 and the synchronization signal S2 may have the same waveform. The synchronization signal S2 can be a second driving signal other than the first driving signal S1. A waveform of the first driving signal S1 may be the same as a waveform of the second driving signal or the synchronization signal S2. Thus, effect of parasitic capacitances between a touch sensor unit and the corresponding display unit may be reduced. More specifically, the synchronization signal S2 can have the same frequency and phase as the first driving signal S1. Furthermore, the synchronization signal S2 can have the same amplitude as the first driving signal S1, or alternatively, the synchronization signal S2 can have an amplitude different from the first driving signal S1.

It is noted that in some embodiments, each of the one or more display electrodes of the display unit 131, 133 and/or 134 corresponding to at least one currently-not-driven-for-sensing touch sensor unit 121, 123 and/or 124 can be further set in the synchronization state. This means that for a part or all of the other touch sensors 121, 123 and/or 124 that currently are not being driven for touch sensing, each of the one or more display electrodes of the corresponding display units 131, 133 and/or 134 can be further set in the synchronization state, by providing the same or a different synchronization signal as the synchronization signal S2. In some other embodiments, each of the one or more display electrodes of the display unit 131, 133 and/or 134 corresponding to at least one currently-not-driven-for-sensing touch sensor unit 121, 123 and/or 124 can be further set in a floating state. This means that for a part or all of the other touch sensors 121, 123 and/or 124 that currently are not being driven for touch sensing, each of the one or more display electrodes of the corresponding display units 131, 133 and/or 134 can be further set in the floating state.

In another embodiment, for reducing effect of parasitic capacitances, each of the one or more display electrodes 130_1~130_4 of the display unit 132 corresponding to a currently-driven-for-sensing touch sensor unit 122 is configured to be in a floating state during the touch sensing period. In the floating state, the display electrode is set to have a high impedance. It is noted that in some embodiments, each of the one or more display electrodes of the display unit 131, 133 and/or 134 corresponding to at least one currently-not-driven-for-sensing touch sensor unit 121, 123 and/or 124 can be further set in the floating state. This means that for a part or all of the other touch sensors that currently are not being driven for touch sensing, each of the one or more display electrodes of the corresponding display units can be further set in the floating state.

It is noted that although the embodiment is illustrated with the display electrode layer patternized into a plurality of blocks for serving as a plurality of display electrodes which are grouped into a plurality of display units, each display unit comprising one or more display electrodes and each display unit respectively corresponding to a touch sensor unit of the plurality of touch sensor units. However, the approach of reducing effect parasitic capacitances between the currently-driven-for-sensing touch sensor unit and the corresponding display electrodes can be applied to other types of touch display panels. For example, in some implementations, the display electrode layer may a whole block not patternized into a plurality of blocks for serving as a plurality of display electrodes. In other words, the whole block can serve as a single display electrode. The display panel can include a plurality of display pixels, each display pixel comprising at least one organic light-emitting diode, wherein the organic light-emitting diode has a first end and a second end (for example, an anode end and a cathode end), and at least one of the first end and the second end (for example, the cathode end), for example, the is formed by the single display electrode. The second control circuit can be still configured to set the single display electrodes in a state, such as a synchronization state or a floating state, capable of reducing effect of parasitic capacitances between the currently-driven-for-sensing touch sensor unit and the single display electrode.

Figure 8A:
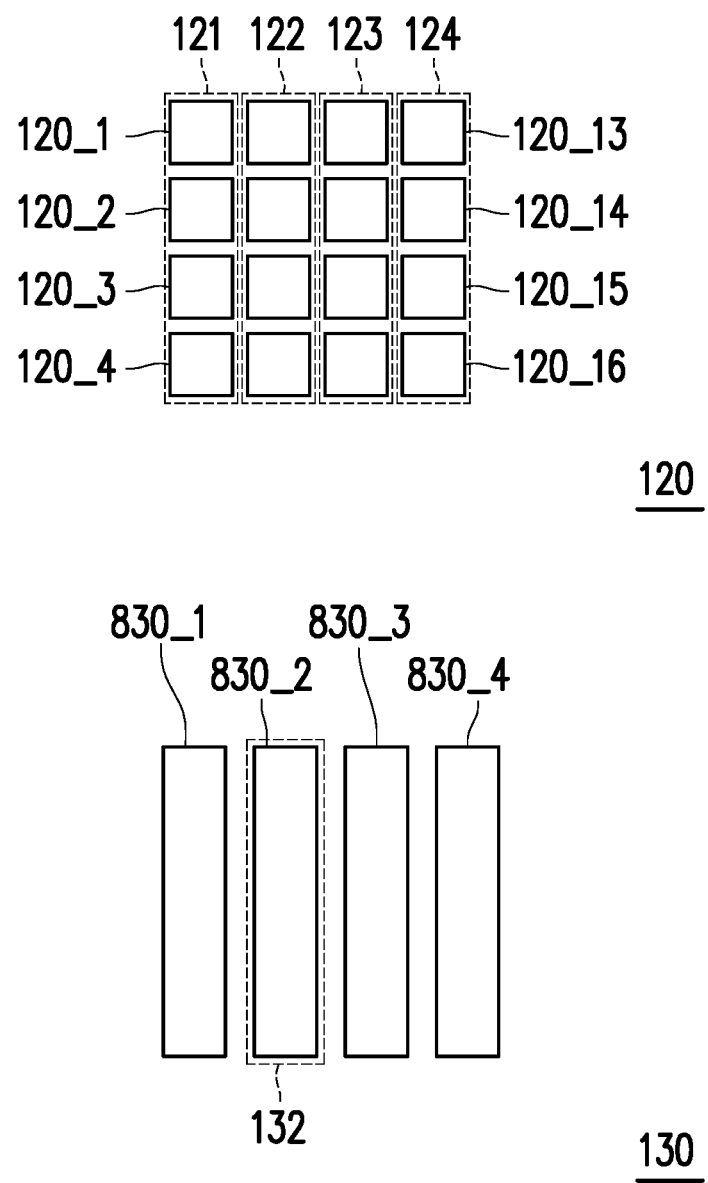
FIG. 8A and FIG. 8B are schematic diagrams illustrating a plurality of touch sensor electrodes and a plurality of OLED cathodes controlled to reduce effect of parasitic capacitances according to an embodiment of the disclosure.
Figure 8B:
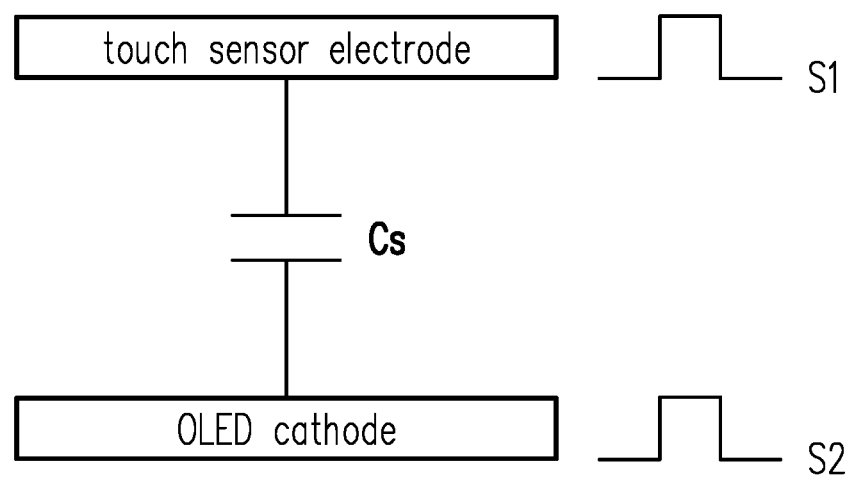

FIG. 8A and FIG. 8B schematic diagrams illustrating a plurality of touch sensor electrodes and a plurality of OLED cathodes controlled to reduce effect of parasitic capacitances according to an embodiment of the disclosure. The plurality of touch sensor electrodes 120_1~120_16 and the plurality of OLED cathodes 830_1~830_4 are illustrated in FIG. 8A. The touch sensor layer 120 includes the touch sensor electrodes 120_1~120_16. The display electrode layer 530 may be an OLED cathode layer. The OLED cathode layer includes the OLED cathodes 830_1~830_4.

The OLED cathodes 830_1~830_4 may be located below the touch sensor electrodes 120_1~120_16. A parasitic capacitance Cs may be generated between a touch sensor electrode 120_1~120_16 and an OLED cathode 830_1~830_4.

The touch sensor electrodes 120_1~120_16 may be grouped into a plurality of touch sensor units. The OLED cathodes 830_1~830_4 may be grouped into a plurality of display units. FIG. 8A shows the touch sensor unit 122 and the display unit 132. As previously described for FIGS. 2-4, the first control circuit 181 may provide a first driving signal S1 to at least one touch sensor electrode of a touch sensor unit. The second control circuit 182 may set each of the display electrodes of a display unit to a state capable of reducing effect of parasitic capacitances between a touch sensor unit and the corresponding display unit. In the example of FIG. 8B, the first control circuit 181 may provide the first driving signal S1 to the touch sensor electrodes 120_5~120_8 of the touch sensor unit 122 to perform touch sensing with touch sensor unit 122. Thus, touch sensor unit 122 may be the currently-driven-for-sensing touch sensor unit.

The display unit 132 may be located below the touch sensor unit 122. Thus, display unit 132 may correspond to the currently-driven-for-sensing touch sensor unit 122. In order to reduce effect of parasitic capacitances like Cs, the second control circuit 182 may be configured to set the OLED cathode 830_2 of the display unit 132 in a synchronization state. The second control circuit 182 may drive the OLED cathode 830_2 of the display unit 132 with a synchronization signal S2 in the synchronization state. Thus, effect of parasitic capacitances between a touch sensor unit and the corresponding display unit may be reduced. In an alternative embodiment, the second control circuit 182 may be configured to set the OLED cathode 830_2 of the display unit 132 in a floating state. In addition, the setting for the OLED cathodes of the display units corresponding to the other currently-not-driven-for-sensing touch sensor units can be analogized from the descriptions of FIGS. 7A and 7B and are hence omitted here for brevity.

Additionally, the plurality of touch sensor electrodes 120_1~120_16 may be grouped into touch sensor units 121~124. The touch sensor units 121~124 may be columns of the array of touch sensor electrodes 120_1~120_16. Thus, the OLED cathodes 830_1~830_4 may also be arranged as columns below the touch sensor electrodes 120_1~120_16.

Figure 9A:
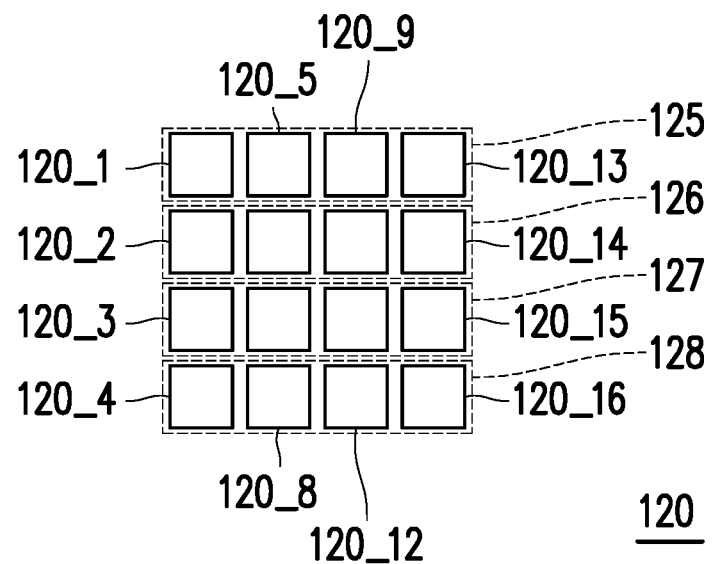
FIG. 9A and FIG. 9B are schematic diagrams illustrating a plurality of touch sensor electrodes and a plurality of OLED cathodes controlled to reduce effect of parasitic capacitances according to an embodiment of the disclosure.
Figure 9A:
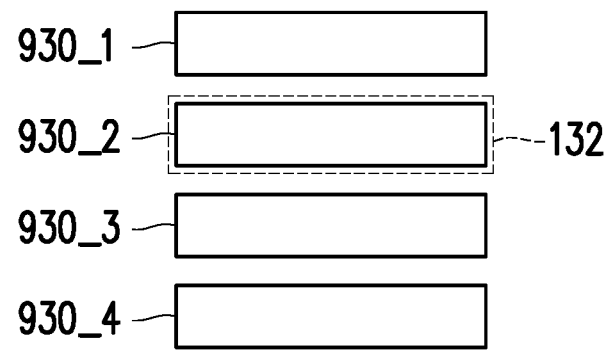
Figure 9B:
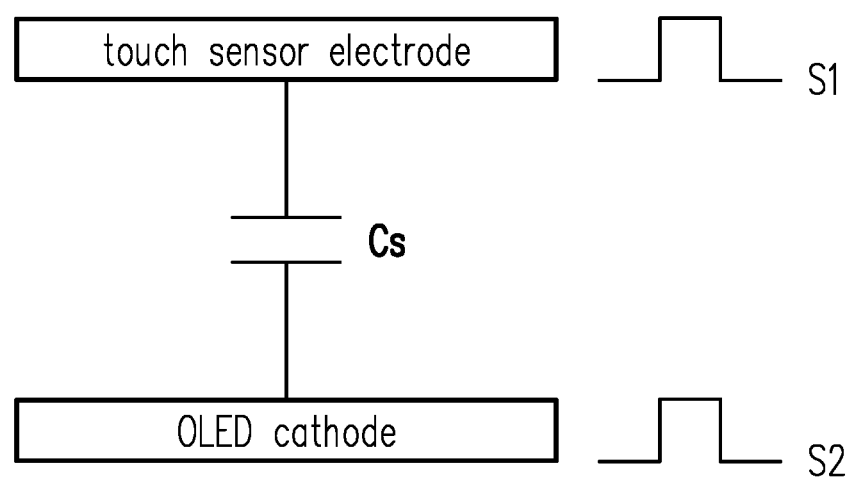

FIG. 9A and FIG. 9B are schematic diagrams illustrating a plurality of touch sensor electrodes and a plurality of OLED cathodes controlled to reduce effect of parasitic capacitances according to an embodiment of the disclosure. The plurality of touch sensor electrodes 120_1~120_16 and the plurality of OLED cathodes 930_1, 930_2, 930_3 and 930_4 are illustrated in FIG. 9A. FIG. 9A is different from FIG. 8A in that the plurality of touch sensor electrodes 120_1~120_16 may be grouped into touch sensor units 125~128. The touch sensor unit 125 may include touch sensor electrodes 120_1, 120_5, 120_9 and 120_13. The touch sensor unit 128 may include touch sensor electrodes 120_4, 120_8, 120_12 and 120_16. The touch sensor electrodes that the touch sensor unit 126 and the touch sensor unit 127 respectively include can be deduced by analogy. The touch sensor units 125~128 may be rows of the array of touch sensor electrodes 120_1~120_16. Thus, the OLED cathodes 930_1930_4 may also be arranged as rows below the touch sensor electrodes 120_1~120_16.

In the embodiments of FIG. 7A to FIG. 9B, the touch display panel may be a self-capacitance touch display panel and each of the one or more first touch sensor electrodes of each touch sensor unit serves as a transmitting electrode and a receiving electrode. For self-capacitance touch display panel, a currently-driven-for-sensing touch sensor unit may be driven with a touch driving signal and may provide a sensing signal to be measured. A currently-not-driven-for-sensing touch sensor unit may not be driven with any touch driving signal or may be still driven without providing any sensing signal to be measured.

Figure 10A:
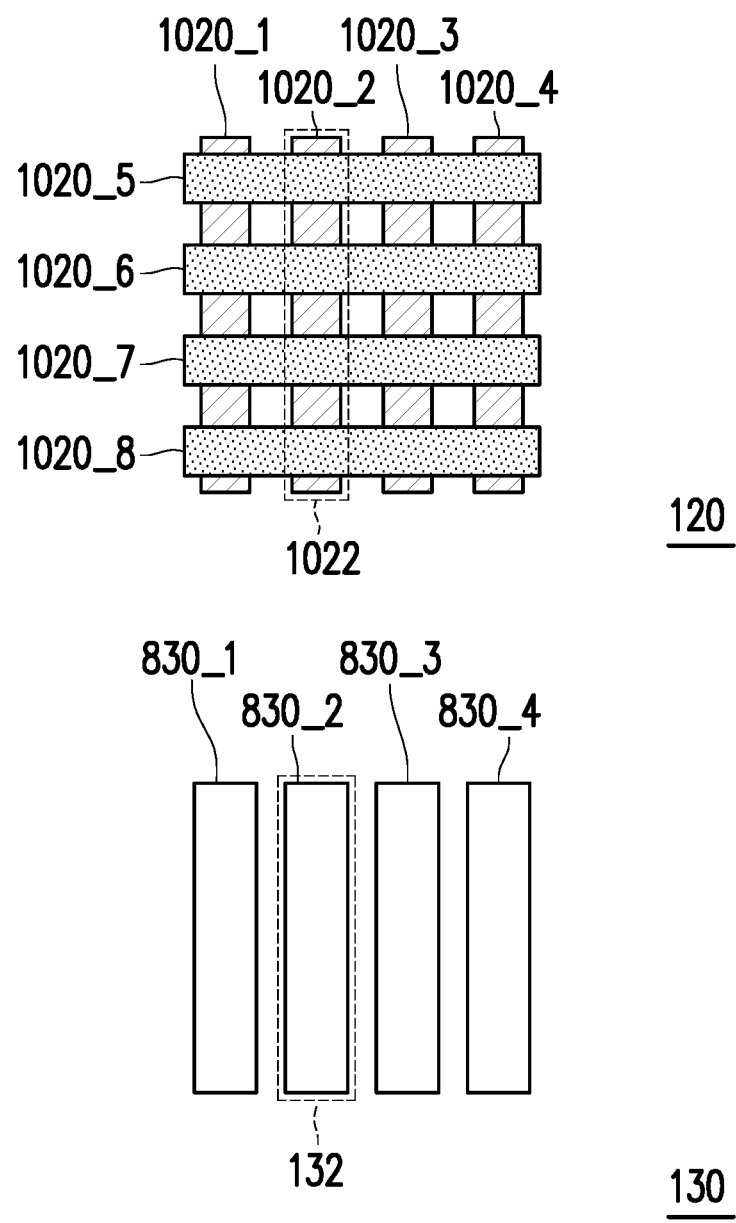
FIG. 10A and FIG. 10B are schematic diagrams illustrating a plurality of touch sensor electrodes and a plurality of OLED cathodes controlled to reduce effect of parasitic capacitances according to an embodiment of the disclosure.
Figure 10B:
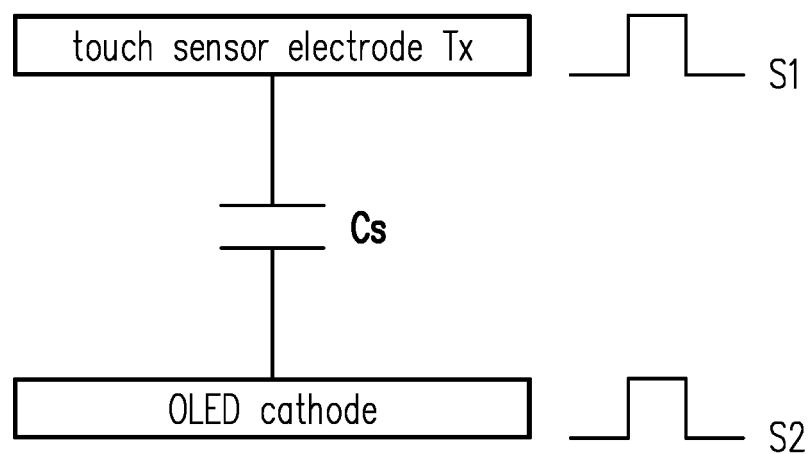

FIG. 10A and FIG. 10B are schematic diagrams illustrating a plurality of touch sensor electrodes and a plurality of OLED cathodes controlled to reduce effect of parasitic capacitances according to an embodiment of the disclosure. A plurality of first touch sensor electrodes 1020_1~1020_4 and second touch sensor electrodes 1020_5~1020_8 and a plurality of OLED cathodes 830_1~830_4 are illustrated in FIG. 10A. Touch sensor electrodes 1020_1~1020_8 may be rectangular touch sensor electrodes. The second touch sensor electrodes 1020_5~1020_8 may be disposed on the plurality of first touch sensor electrodes 1020_1~1020_4. The plurality of second touch sensor electrodes 1020_5~1020_8 may be formed in a second touch sensor layer. That is to say, the touch display panel 100 further includes the second touch sensor layer that is disposed on the substrate and patternized into a plurality of blocks for serving as the plurality of second touch sensor electrodes 1020_5~1020_8. The touch display panel may be a mutual-capacitance touch display panel and include the first touch sensor electrodes 1020_1~1020_4 and the second touch sensor electrodes 1020_5~1020_8. For a mutual-capacitance touch display panel, a currently-driven-for-sensing touch sensor unit may be driven with a touch driving signal such that a sensing signal is provided by receiving electrodes. A currently-not-driven-for-sensing touch sensor unit may not be driven with any touch driving signal or may be still driven without any sensing signal to be provided and measured by receiving electrodes.

Each first touch sensor electrode 1020_1~1020_4 may be configured to serve as a transmitting electrode Tx. Each second touch sensor electrode 1020_5~1020_8 may be configured to serve as a receiving electrode. FIG. 10A shows that the transmitting electrode 1020_2 of touch sensor unit 1022 and the receiving electrodes 1020_5~1020_8 may be arranged in different directions. In FIG. 10A, the transmitting electrodes are filled with lines, and the receiving electrodes are filled with dots. Touch sensing may be performed by sensing a change in capacitance between a transmitting electrode Tx and a receiving electrode. The OLED cathodes 830_1~830_4 may be located below the touch sensor electrodes 1020_1~1020_8. A parasitic capacitance Cs may be generated between a transmitting electrode Tx and an OLED cathode 830_1~830_4.

The first touch sensor electrodes 1020_1~1020_4 may be grouped into a plurality of touch sensor units. The OLED cathodes 830_1~830_4 may be grouped into a plurality of display units. The touch sensor units 1022 and the display units 132 are shown on FIG. 10A. As previously described for FIGS. 2-4, the first control circuit 181 may provide a first driving signal S1 to at least one touch sensor electrode of a touch sensor unit. The second control circuit 182 may set each of the display electrodes of a display unit to a state capable of reducing effect of parasitic capacitances between a touch sensor unit and the corresponding display unit. In the example of FIG. 10B, the first control circuit 181 may provide the first driving signal S1 to the first touch sensor electrode 1020_2 of the touch sensor unit 1022 to perform sensing with touch sensor unit 1022. Thus, the touch sensor unit 1022 may be the currently-driven-for-sensing touch sensor unit. The touch sensor electrode 1020_2 may be a touch sensor electrode Tx, and the second touch sensor electrodes 1020_5~1020_8 may be receiving electrodes, for example.

The display unit 132 may be located below the touch sensor unit 1022. Thus, the display unit 132 may correspond to the currently-driven-for-sensing touch sensor unit 1022. In order to reduce effect of parasitic capacitances like Cs, the second control circuit 182 may be configured to set the OLED cathode 830_2 of the display unit 132 in a synchronization state. The second control circuit 182 may drive the OLED cathode 830_2 of the display unit 132 with a synchronization signal S2. Thus, effect of parasitic capacitances between a touch sensor unit and the corresponding display unit may be reduced. In an alternative embodiment, the second control circuit 182 may be configured to set the OLED cathode 830_2 of the display unit 132 in a floating state. In addition, the setting for the OLED cathodes of the display units corresponding to the other currently-not-driven-for-sensing touch sensor units can be analogized from the descriptions of FIGS. 7A and 7B and are hence omitted here for brevity.

Additionally, the touch sensor unit 1022 may be a column of the array of touch sensor electrodes 1020_1~1020_8. Thus, the OLED cathodes 830_1~830_4 may also be arranged as columns below the touch sensor electrodes 1020_1~1020_8.

Figure 11A:
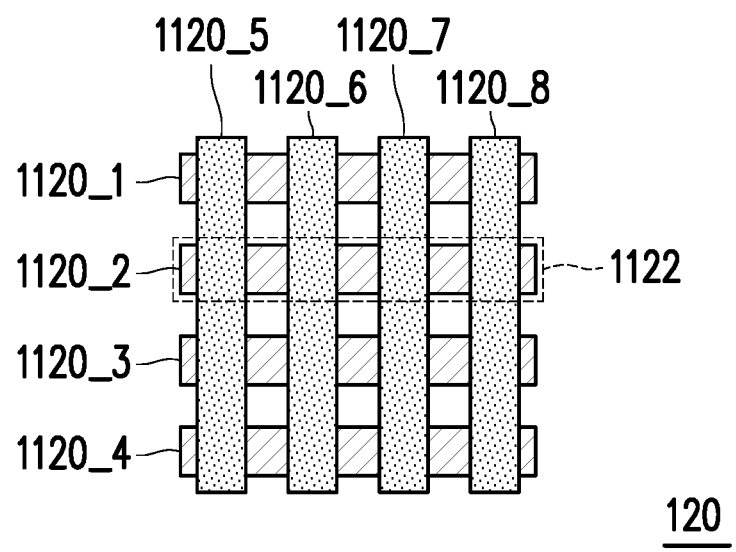
FIG. 11A and FIG. 11B are schematic diagrams illustrating a plurality of touch sensor electrodes and a plurality of LCD common electrodes controlled to reduce effect of parasitic capacitances according to an embodiment of the disclosure.
Figure 11A:
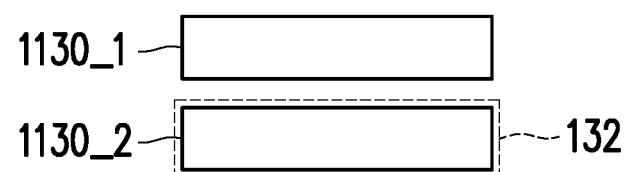
Figure 11A:
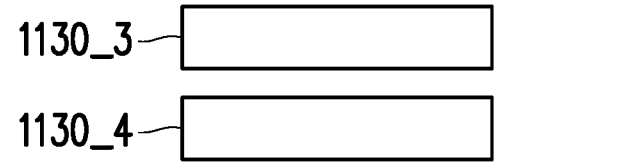
Figure 11B:
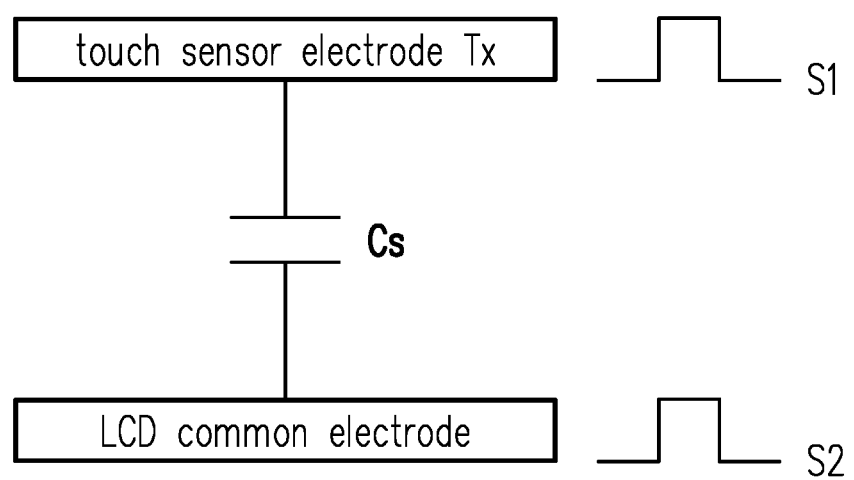

FIG. 11A and FIG. 11B are schematic diagrams illustrating a plurality of touch sensor electrodes and a plurality of LCD common electrodes controlled to reduce effect of parasitic capacitances according to an embodiment of the disclosure. FIG. 11A illustrates a plurality of first touch sensor electrodes 1120_1~1120_4 and second touch sensor electrodes 1120_5~1120_8 and a plurality of LCD common electrodes 1130_1~1130_4. The plurality of first touch sensor electrodes 1120_1~1120_4 may be grouped into touch sensor units, including touch sensor unit 1122.

The difference between FIG. 1A and FIG. 10A, for example, lies in that the display electrodes 1130_1~1130_4 of FIG. 11 are LCD common electrodes, and the touch sensor units 1122 of FIG. 11A are rows of the array of touch sensor electrodes 1120_1~1120_8. The LCD common electrodes 1130_1~1130_4 may also be arranged as rows below the touch sensor electrodes 1120_1~11020_8. Further description is similar to the description of FIG. 10A and FIG. 10B.

The display unit 132 may be located below the touch sensor unit 1122 and correspond to the currently-driven-for-sensing touch sensor unit 1122. In order to reduce effect of parasitic capacitances like Cs, the second control circuit 182 may be configured to set the LCD common electrode 1130_2 of the display unit 132 in a synchronization state. The second control circuit 182 may drive the LCD common electrode 1130_2 of the display unit 132 with a synchronization signal S2. Thus, effect of parasitic capacitances between a touch sensor unit and the corresponding display unit may be reduced. In an alternative embodiment, the second control circuit 182 may be configured to set the LCD common electrode 1130_2 of the display unit 132 in a floating state. In addition, the setting for the LCD common electrodes of the display units corresponding to the other currently-not-driven-for-sensing touch sensor units can be analogized from the descriptions of FIGS. 7A and 7B and are hence omitted here for brevity.

Additionally, FIG. 10A FIG. 11B show that the transmitting electrodes of the touch sensor units and the receiving electrodes may be arranged in different directions.

Figure 12A:
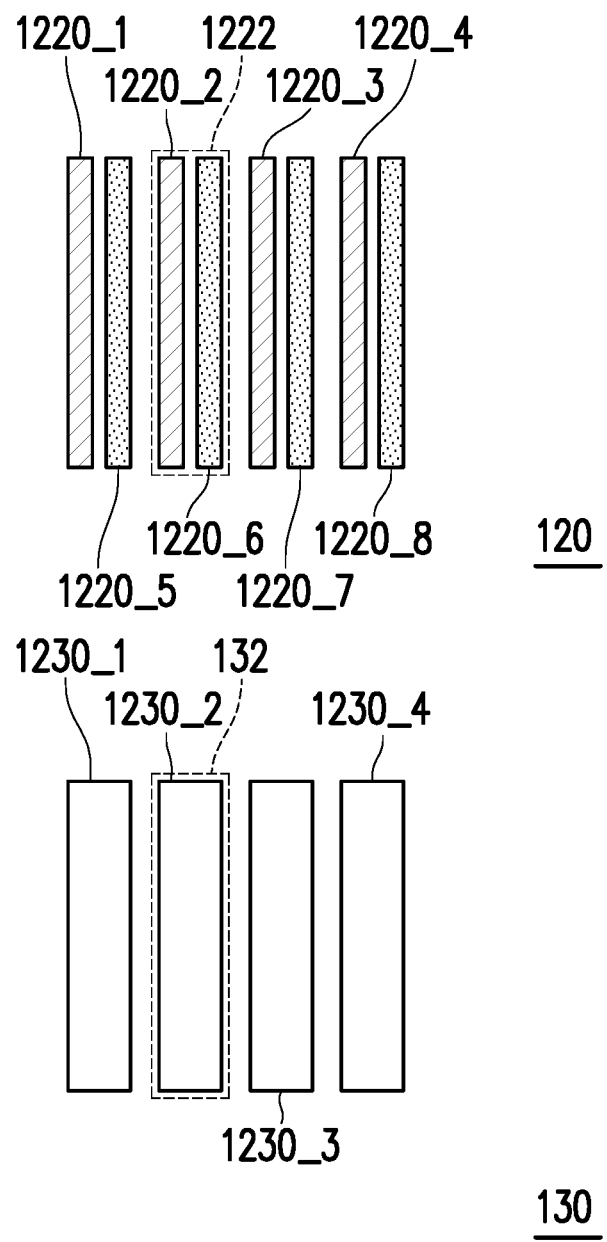
FIG. 12A and FIG. 12B are schematic diagrams illustrating a plurality of touch sensor electrodes and a plurality of LCD common electrodes controlled to reduce effect of parasitic capacitances according to an embodiment of the disclosure.
Figure 12B:
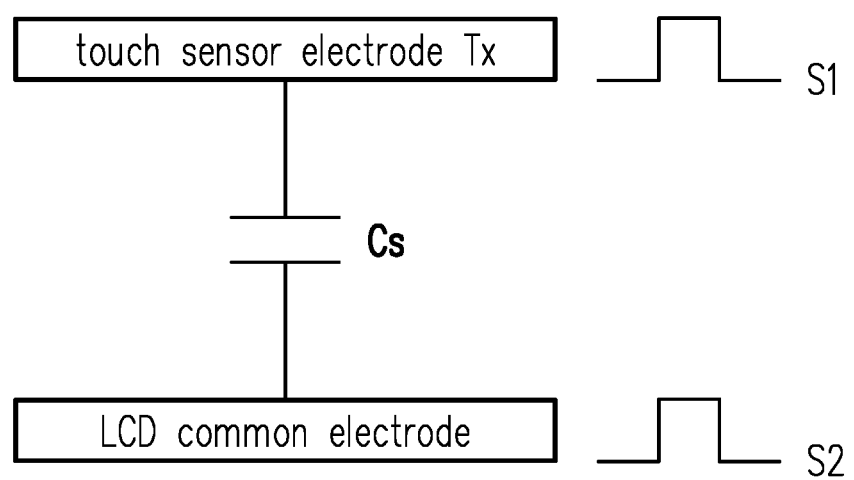

FIG. 12A and FIG. 12B schematic diagrams illustrating a plurality of touch sensor electrodes and a plurality of LCD common electrodes controlled to reduce effect of parasitic capacitances according to an embodiment of the disclosure. The touch display panel of the present embodiment can be a mutual-capacitance touch display panel. FIG. 12A illustrates a plurality of first touch sensor electrodes 1220_1~1220_4 and 1220_5~1220_8. Two first touch sensor electrodes may be grouped into a touch sensor unit. At least one of the one or more first touch sensor electrodes of each touch sensor unit is configured to serve as a transmitting electrode, and at least another one of the one or more first touch sensor electrodes of each touch sensor unit is configured to serve as a receiving electrode during a touch sensing period. For example, the touch sensor unit 1222 may include the first touch sensor electrodes 1220_2 and 1220_6, and the first touch sensor electrode 1220_2 filled with lines serves as a transmitting electrode and the first touch sensor electrode 1220_6 filled with dots serves as a receiving electrode. The respective first touch sensor electrodes that other touch sensor units 1222 include can be deduced by analogy. FIG. 12A also illustrates a plurality of LCD common electrodes 1230_1~1230_4. The LCD common electrodes 1230_1~1230_4 may be grouped into a plurality of display units. For example, the display unit 132 may include the LCD common electrodes 1230_2.

In addition, FIG. 12A is different from FIG. 11A in that the touch sensor units of FIG. 12 may be columns of the array of touch sensor electrodes 1220_1~1220_8. Thus, the LCD common electrodes 1230_1~1230_4 may also be arranged as columns below the touch sensor electrodes 1120_1~1120_8. Further description is similar to the description of FIG. 11A and FIG. 11B. Additionally, FIG. 12A shows that the transmitting electrodes of the touch sensor units and the receiving electrodes may be arranged in the same direction.

Figure 13A:
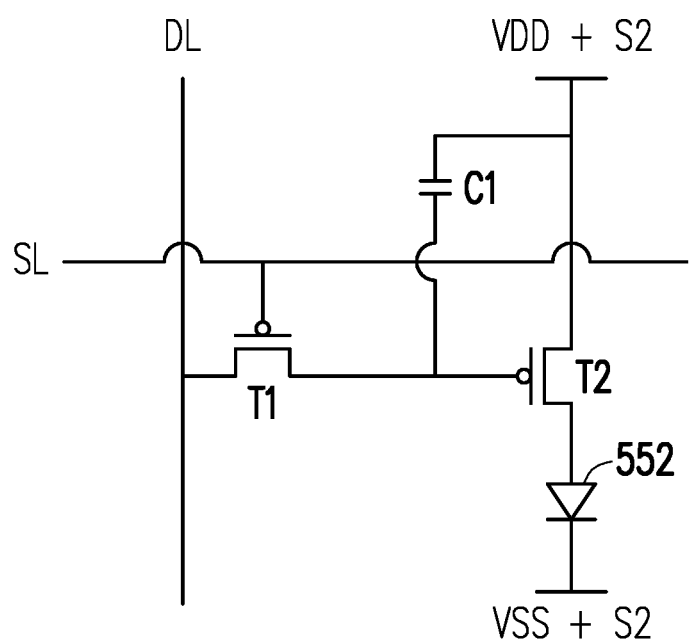
FIG. 13A is a schematic diagram illustrating a display pixel according to an embodiment of the disclosure.
Figure 13B:
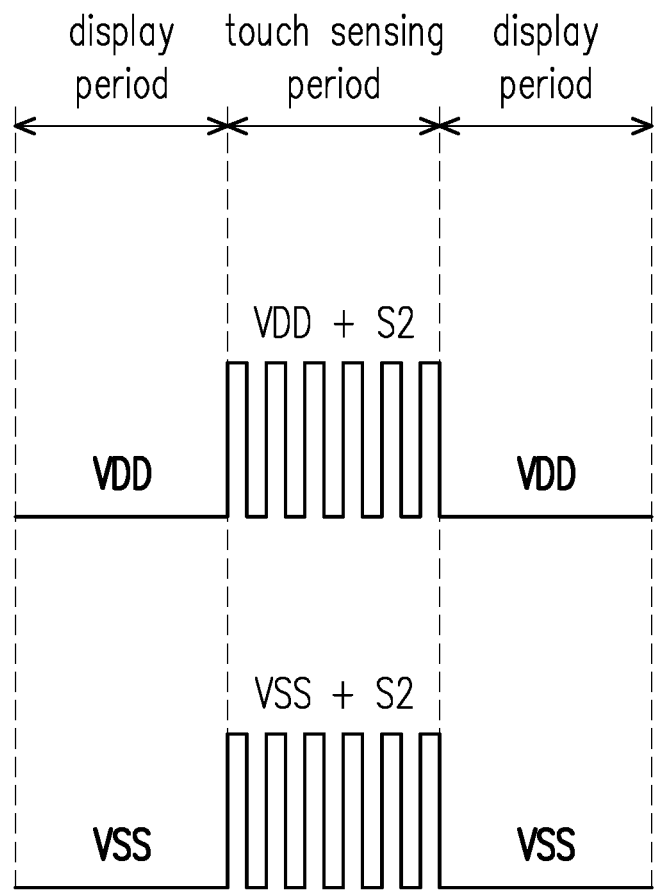
FIG. 13B a schematic diagram illustrating signals for driving the display pixel depicted in FIG. 13A.

FIG. 13A is a schematic diagram illustrating a display pixel according to an embodiment of the disclosure. FIG. 13B a schematic diagram illustrating signals for driving the display pixel depicted in FIG. 13A. FIG. 13A shows an OLED 552 similar to the OLEDs of FIG. 5. In the present embodiment, each of the one or more display electrodes of the display unit corresponding to the currently-driven-for-sensing touch sensor unit is configured to receive a synchronization signal S2 during the touch sensing period.

To be specific, the touch display panel 100 includes a plurality of display pixels 200. Each display pixel 200 includes at least one OLED 552. The OLED 552 has a first end and a second end. One of the first end and the second end may serve as one of the display electrodes of the display electrode layer 530.

The scan line SL is coupled to a control terminal of the transistor T1 for turning on or turning off the transistor T1. A first terminal of transistor T1 may be coupled to a data line DL. When the transistor T1 is turned on, the voltage on the data line DL may be transferred from the first terminal of transistor T1 to a second terminal of transistor T1. The second terminal of transistor T1 may be coupled to a first terminal of capacitor C1. The second terminal of transistor T1 may be coupled to a control terminal of the transistor T2. A first terminal of transistor T2 may be coupled to a first voltage VDD or a third voltage (denoted as "VDD+S2"), where S2 may be a synchronization signal. The first terminal of the transistor T2 may be coupled to a second terminal of capacitor C1. A second terminal of transistor T2 may be coupled to the first end of the OLED 552. The second end of the OLED 552 may be coupled to a second voltage SS or a fourth voltage (VSS+S2). The level of the first voltage VDD (the first voltage level) may be greater than that of the second voltage VSS (the second voltage level).

When the transistor T1 is turned on by using the scan line SL, the voltage on the data line DL may be transferred to the control terminal of the transistor T2. Thus, the transistor T2 may be turned on and an electric current may be outputted to drive the OLED 552.

FIG. 13B shows signal waveforms during a display period and a touch sensing period. During the display period, the first terminal of transistor T2 may be coupled to the voltage VDD, and the second end of the OLED 552 may be coupled to the voltage VSS. During the touch sensing period, the first terminal of transistor T2 may be coupled to the voltage (VDD+S2), and the second end of the OLED 552 may be coupled to the voltage (VSS+S2). Thus, the first end of the OLED 552 may be coupled to a third voltage. A voltage difference between the third voltage and the synchronization signal S2 is substantially constant. The third voltage may have a waveform the same as the synchronization signal S2. More specifically, the synchronization signal S2 can have the same frequency and phase as the third voltage. Furthermore, the synchronization signal S2 can have the same amplitude as the third voltage, or alternatively, the synchronization signal S2 can have an amplitude different from the third voltage. In an embodiment of the disclosure, the second voltage VSS may be zero. Thus, the second end of the OLED 552 may be coupled to a fourth voltage serving as the synchronization signal S2 during the touch sensing period.

Furthermore, a level difference of a direct current (DC) level of the third voltage (VDD+S2) and the fourth voltage (VSS+S2) may be the same as a level difference of a DC level of the first voltage VDD and a DC level of the second voltage VSS. The level difference may be the same as that in the display period, i.e., (VDD-VSS).

Figure 14A:
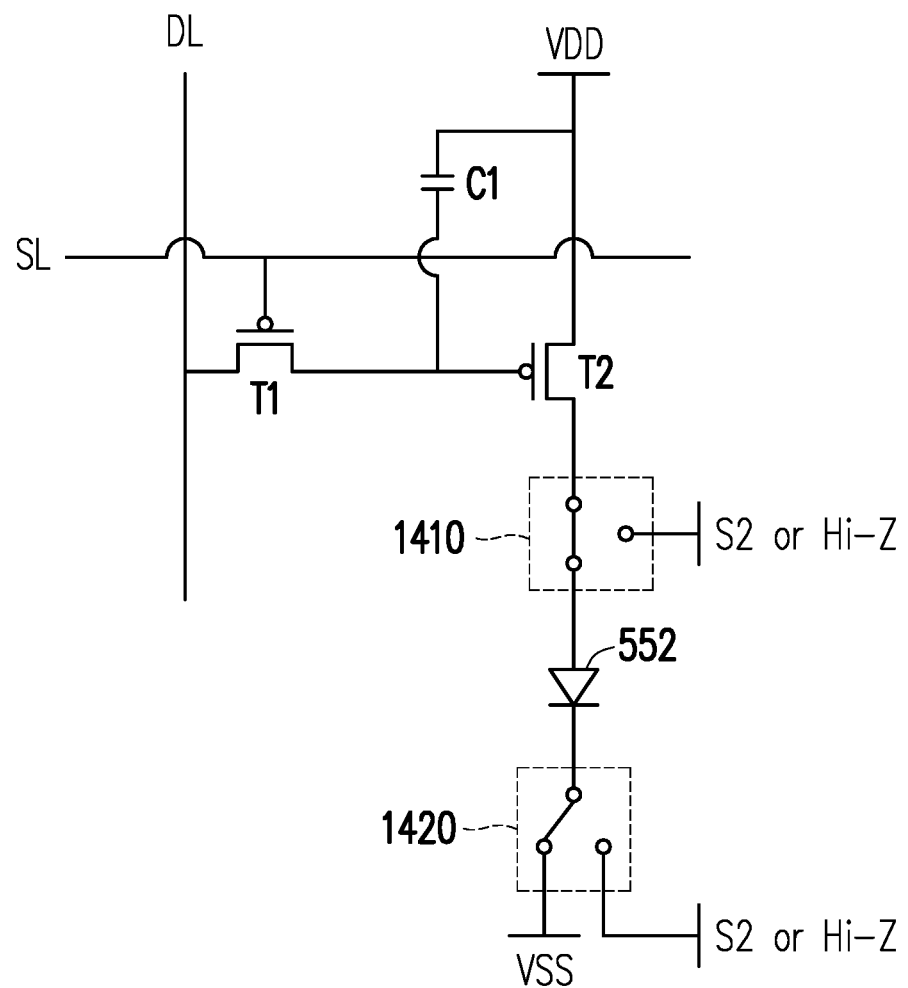
FIG. 14A is a schematic diagram illustrating a display pixel operating during a display period according to an embodiment of the disclosure.
Figure 14B:
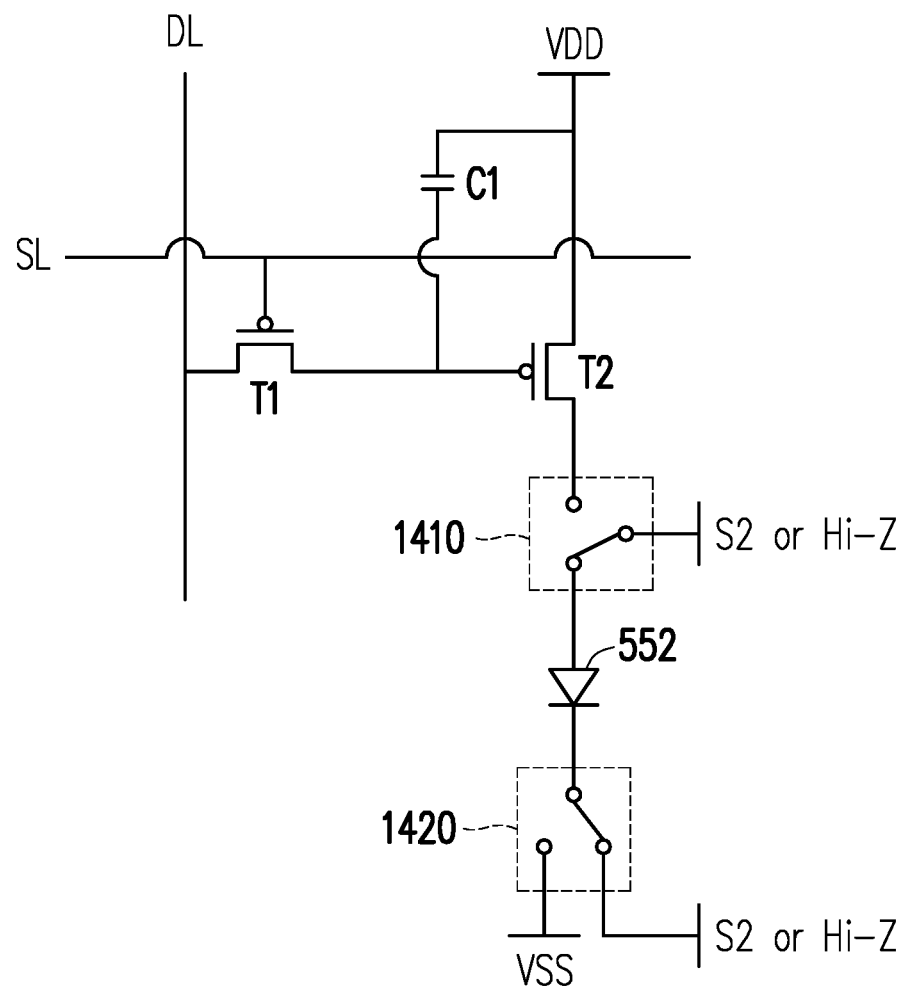
FIG. 14B is a schematic diagram illustrating the display pixel depicted in FIG. 14A operating during a touch sensing period.

FIG. 14A is a schematic diagram illustrating a display pixel operating during a display period according to an embodiment of the disclosure. FIG. 14B is a schematic diagram illustrating the display pixel depicted in FIG. 14A operating during a touch sensing period. The display pixel 200 of FIG. 14A and FIG. 14B is similar to that of FIG. 13 but further includes a first switch 1410 and a second switch 1420. A first end of the OLED 552 may be coupled to the first switch 1410. A second end of the OLED 552 may be coupled to the second switch 1420. In the present embodiment, the second control circuit 182 may be configured to control switching of the first switch 1410 and the second switch 1420.

FIG. 14A illustrates switching of the first switch 1410 and the second switch 1420 during a display period. The second control circuit 182 may be configured to switch the first switch 1410 such that the first end of OLED 552 may be coupled to the second terminal of transistor T2. The first terminal of the transistor T2 may be coupled to the first voltage VDD. The second control circuit 182 may be configured to switch the second switch 1420 such that the second end of OLED 552 may be coupled to the voltage VSS. Therefore, the first switch 1410 is switched to be coupled to the first voltage VDD, and the second switch 1420 is switched to be coupled to the second voltage VSS during the display period. The first voltage VDD is larger than the second voltage VSS.

FIG. 14B illustrates switching of the first switch 1410 and the second switch 1420 during a touch sensing period. In the present embodiment, each of the one or more display electrodes of the display unit corresponding to a currently-driven-for-sensing touch sensor unit can be configured to be in a synchronization state or in a floating state during the touch sensing period. The second control circuit 182 may be configured to switch the first switch 1410 such that the first end of the OLED 552 may be coupled to the synchronization signal S2 or to a high impedance Hi-Z end. The second control circuit 182 may be configured to switch the second switch 1420 such that the second end of the OLED 552 may be coupled to the synchronization signal S2 or to the high impedance Hi-Z end.

When the first switch 1410 and the second switch 1420 are switched to the synchronization signal S2 during the touch sensing period, the display electrode of the display unit corresponding to a currently-driven-for-sensing touch sensor unit is in the synchronization state during the touch sensing period. When the first switch 1410 and the second switch 1420 are switched to the high impedance Hi-Z end during the touch sensing period, the display electrode of the display unit corresponding to a currently-driven-for-sensing touch sensor unit is in the floating state during the touch sensing period. Thus, effect of parasitic capacitances between the OLED 552 and a corresponding touch sensor unit may be reduced. FIG. 14A and FIG. 14B are similar to FIG. 13. Description of other elements of FIG. 14A and FIG. 14B may be found in the description of FIG. 13.

In an embodiment, the synchronization signal S2 of FIG. 14A and FIG. 14B may be the first driving signal S1 of FIG. 2. In another embodiment, the synchronization signal S2 may be a second driving signal which may be other than the first driving signal S1. A voltage difference between the first driving signal S1 and the synchronization signal S2 can be substantially constant.

Figure 15:
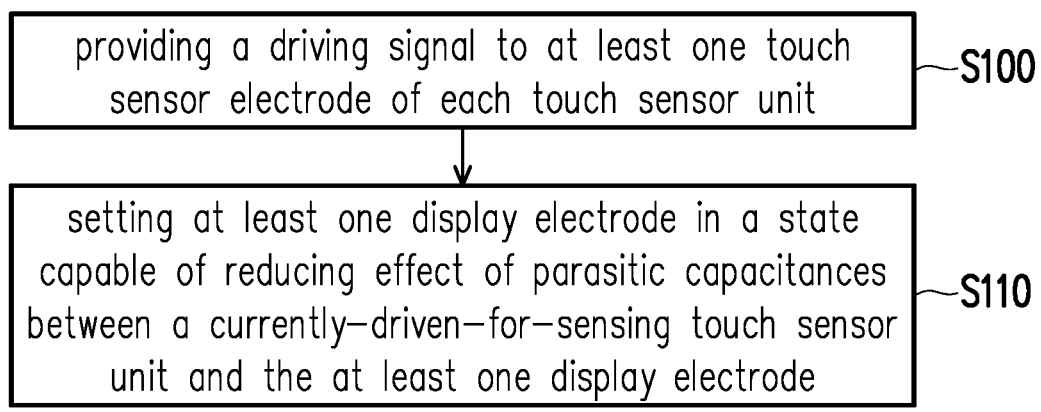
FIG. 15 is a flowchart illustrating detail steps in a touch control method according to an embodiment of the invention.

FIG. 15 is a flowchart illustrating detail steps in a touch control method according to an embodiment of the invention. Referring to FIG. 1 to FIG. 4 and FIG. 15, in the present embodiment, the touch control method is at least adapted to the touch control circuit 180 depicted in FIG. 4 and the touch display panel 100 depicted in FIG. 1, but the invention is not limited thereto. Taking the touch control circuit 180 and the touch display panel 100 for example, in step S100, the touch control circuit 180 provides a first driving signal S1 to at least one of the one or more first touch sensor electrodes 120_1~120_16 of each touch sensor unit 121~124. In step S110, the touch control circuit 180 sets at least one of the one or more display electrodes 130_1~130_4 in a state capable of reducing effect of parasitic capacitances between a currently-driven-for-sensing touch sensor unit and the at least one of the one or more display electrodes.

The touch control method described of the embodiment of the invention is sufficiently taught, suggested, and embodied in the embodiments illustrated in FIG. 1 to FIG. 14B, and therefore no further description is provided herein.

In view of the aforementioned descriptions, the disclosure is directed to a touch display panel and a touch control circuit configured to drive the touch display panel. The touch display panel may include a touch sensor layer and a display electrode layer. The touch sensor layer may be patternized into a plurality of blocks for serving as a plurality of first touch sensor electrodes. The display electrode layer may be patternized into a plurality of blocks for serving as a plurality of display electrodes. The touch control circuit may perform touch sensing operation with one of the touch sensor units. The touch control circuit may couple a synchronization signal to the display unit corresponding to a currently-driven-for-sensing touch sensor unit. Alternatively, the touch control circuit may set the display unit corresponding to a currently-driven-for-sensing touch sensor unit to a floating state. Thus, the touch control circuit may reduce effect of parasitic capacitances between the currently-driven-for-sensing touch sensor unit and the corresponding display unit, and lower power consumption.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A touch display panel, comprising:
   a substrate;
   a first touch sensor layer, disposed on the substrate and patternized into a plurality of blocks for serving as a plurality of first touch sensor electrodes, wherein the first touch sensor electrodes are grouped into a plurality of touch sensor units, each touch sensor unit comprises one or more first touch sensor electrodes, and at least one of the one or more first touch sensor electrodes of each touch sensor unit is configured to serve as a transmitting electrode during a touch sensing period; and
   a display electrode layer, disposed between the substrate and the first touch sensor layer, wherein the touch display panel is an organic light-emitting diode (OLED) panel further comprising a plurality of OLEDs, and the display electrode layer is an OLED cathode layer of the OLEDs, and
   wherein the OLED cathode layer is patternized into a plurality of OLED cathodes for serving as a plurality of display electrodes and not for serving as touch sensor electrodes, wherein the plurality of OLED cathodes are grouped into a plurality of display units, and each display unit having one or more OLED cathodes is respectively corresponding to a touch sensor unit of the plurality of touch sensor units.

2. The touch display panel of claim 1, wherein each of the touch sensor units is located above the corresponding display electrode.

3. The touch display panel of claim 1, wherein each of the touch sensor units comprises a first number of one or more first touch sensor electrodes and each of the corresponding display units comprises a second number of one or more display electrodes, wherein the second number is unequal to the first number.

4. The touch display panel of claim 3, wherein the first number is greater than the second number and a respective area of each first touch sensor electrode of each touch sensor unit is smaller than a respective area of each display electrode of each display unit.

5. The touch display panel of claim 4, wherein the first number is greater than 1 and the second number is 1.

6. The touch display panel of claim 1, wherein each of the touch sensor units comprises a first number of one or more first touch sensor electrodes and each of the corresponding display units comprises a second number of one or more display electrodes, wherein the second number is equal to the first number.

7. The touch display panel of claim 3, wherein a respective area of each first touch sensor electrode of each touch sensor unit is smaller than or equal to a respective area of each display electrode of each display unit.

8. The touch display panel of claim 1, wherein an area of each touch sensor unit is smaller than or equal to an area of the corresponding display unit.

9. The touch display panel of claim 1, wherein the touch display panel is a self-capacitance touch display panel and each of the one or more first touch sensor electrodes of each touch sensor unit serves as a transmitting electrode and a receiving electrode.

10. The touch display panel of claim 1, wherein the touch display panel is a mutual-capacitance touch display panel and at least another one of the one or more first touch sensor electrodes of each touch sensor unit is configured to serve as a receiving electrode.

11. The touch display panel of claim 10, wherein the transmitting electrodes and the receiving electrodes of the touch sensor units are arranged in the same direction.

12. The touch display panel of claim 1, wherein the touch display panel is a mutual-capacitance touch display panel wherein each first touch sensor electrode of each touch sensor unit is configured to serve as a transmitting electrode.

13. The touch display panel of claim 12, wherein the touch display panel further comprises a second touch sensor layer, disposed on the substrate and patternized into a plurality of blocks for serving as a plurality of second touch sensor electrodes, and each of the second touch sensor electrodes is configured to serve as a receiving electrode.

14. The touch display panel of claim 13, wherein the transmitting electrodes of the touch sensor units and the receiving electrodes are arranged in different directions.

15. The touch display panel of claim 1, wherein a touch sensor unit of the plurality of touch sensor units is driven by a first driving signal to be a currently-driven-for-sensing touch sensor unit, wherein each of the one or more display electrodes of the display unit corresponding to the currently-driven-for-sensing touch sensor unit is configured to receive a synchronization signal during the touch sensing period, wherein a voltage different difference between the synchronization signal and the first driving signal is substantially constant.

16. The touch display panel of claim 15, further comprising:
a plurality of display pixels, each display pixel comprising at least one organic light-emitting diode,
wherein the organic light-emitting diode has a first end and a second end, and one of the first end and the second end serves as one of the display electrodes.

17. The touch display panel of claim 16, wherein the first end is coupled to a first voltage having a first voltage level, the second end is coupled to a second voltage having a second voltage level during a display period, and the first voltage level is greater than the second voltage level.

18. The touch display panel of claim 17, wherein the first end is coupled to a third voltage and the second end is coupled to a fourth voltage serving as the synchronization signal during the touch sensing period, wherein a voltage difference between the third voltage and the synchronization signal is substantially constant.

19. The touch display panel of claim 18, wherein a level difference of a direct current (DC) level of the third voltage and a DC level of the fourth voltage is the same as a level difference of a DC level of the first voltage and a DC level of the second voltage.

20. The touch display panel of claim 16, wherein the first end is coupled to a first switch and the second end is coupled to a second switch,
the first switch is switched to be coupled to a first voltage and the second switch is switched to be coupled to a second voltage during a display period, and the first voltage is larger than the second voltage, and
the first switch is switched to be coupled to the synchronization signal and the second switch is switched to be coupled to the synchronization signal during the touch sensing period.

21. The touch display panel of claim 1, wherein each of the one or more display electrodes of the display unit corresponding to a currently-driven-for-sensing touch sensor unit is configured to be in a floating state during the touch sensing period.

22. The touch display panel of claim 21, further comprising:
a plurality of display pixels, each display pixel comprising an organic light-emitting diode,
wherein the organic light-emitting diode has a first end and a second end, and one of the first end and the second end serves as one of the display electrodes.

23. The touch display panel of claim 22, wherein the first end is coupled to a first switch and the second end is coupled to a second switch, wherein
the first switch is switched to be coupled to a first voltage and the second switch is switched to be coupled to a second voltage during a display period, and the first voltage is larger than the second voltage and
the first switch is switched to a high impedance end and the second switch is switched to the high impedance end during the touch sensing period.

24. A touch control circuit configured to control a touch display panel, the touch display panel comprising a substrate, a first touch sensor layer, disposed on the substrate and patterned into a plurality of blocks for serving as a plurality of first touch sensor electrodes, wherein the first touch sensor electrodes are grouped into a plurality of touch sensor units, each touch sensor unit comprising one or more first touch sensor electrodes, and a display electrode layer, disposed between the substrate and the first touch sensor layer, the touch display panel being an organic light-emitting diode (OLED) panel further comprising a plurality of OLEDs, wherein the display electrode layer is an OLED cathode layer of the OLEDs, and the OLED cathode layer is patterned into a plurality of OLED cathodes for serving as a plurality of display electrodes and not for serving as touch sensor electrodes, wherein the plurality of OLED cathodes are grouped into a plurality of display units, and each display unit having one or more OLED cathodes is respectively corresponding to a touch sensor unit of the plurality of touch sensor units, and wherein the touch display panel further comprises a plurality of display pixels, and each of the plurality of display pixels comprises at least one organic light-emitting diode, wherein the at least one organic light-emitting diode has a first end and a second end, and at least one of the first end and the second end is formed by one of the plurality of display electrodes, the touch control circuit comprising:
a first control circuit configured to provide a first driving signal to at least one of the one or more first touch sensor electrodes of each touch sensor unit, the at least one of the one or more first touch sensor electrodes is configured to serve as a transmitting electrode during a touch sensing period; and
a second control circuit configured to set at least one of the one or more display electrodes in a state capable of reducing effect of parasitic capacitances between a currently-driven-for-sensing touch sensor unit and the at least one of the one or more display electrodes.

25. The touch control circuit of claim 24, wherein the second control circuit is configured to set each of the one or more display electrodes of the display unit corresponding to the currently-driven-for-sensing touch sensor unit in a state capable of reducing effect of parasitic capacitances between the currently-driven-for-sensing touch sensor unit and the corresponding display unit.

26. The touch control circuit of claim 25, wherein the second control circuit is configured to set each of the one or more display electrodes of the display unit corresponding to the currently-driven-for-sensing touch sensor unit in a synchronization state to receive a synchronization signal during the touch sensing period, wherein a voltage difference between the synchronization signal and the first driving signal is substantially constant.

27. The touch control circuit of claim 26, wherein the second control circuit is further configured to set each of the one or more display electrodes of the display unit corresponding to at least one currently-not-driven-for-sensing touch sensor unit in the synchronization state.

28. The touch control circuit of claim 25, wherein the second control circuit is configured to set each of the one or more display electrodes of the display unit corresponding to the currently-driven-for-sensing touch sensor unit in a floating state during the touch sensing period.

29. The touch control circuit of claim 28, wherein the second control circuit is further configured to set each of the one or more display electrodes of the display unit corresponding to at least one currently-not-driven-for-sensing touch sensor unit in the floating state.

30. The touch control circuit of claim 26, wherein the second control circuit is configured to control the first end to be coupled to a voltage and control the second end to be coupled to another voltage serving as the synchronization signal during the touch sensing period, wherein a voltage difference between the voltage coupled to the first end and the synchronization signal is substantially constant.

31. The touch control circuit of claim 26, wherein the first end is coupled to a first switch and the second end is coupled to a second switch,
the second control circuit is configured to switch the first switch to be coupled to a first voltage and switch the second switch to be coupled to a second voltage during a display period, and the first voltage is larger than the second voltage, and
the second control circuit is configured to switch the first switch to be coupled to the synchronization signal and switch the second switch to be coupled to the synchronization signal during the touch sensing period.

32. A touch control method configured to control a touch display panel, the touch display panel comprising a substrate, a first touch sensor layer, disposed on the substrate and patternized into a plurality of blocks for serving as a plurality of first touch sensor electrodes, wherein the first touch sensor electrodes are grouped into a plurality of touch sensor units, each touch sensor unit comprising one or more first touch sensor electrodes, and a display electrode layer, disposed between the substrate and the first touch sensor layer, the touch display panel being an organic light-emitting diode (OLED) panel further comprising a plurality of OLEDs, wherein the display electrode layer is an OLED cathode layer of the OLEDs, and the OLED cathode layer is patternized into a plurality of OLED cathodes for serving as a plurality of display electrodes and not for serving as touch sensor electrodes, wherein the plurality of OLED cathodes are grouped into a plurality of display units, and each display unit having one or more OLED cathodes is respectively corresponding to a touch sensor unit of the plurality of touch sensor units, and wherein the touch display panel further comprises a plurality of display pixels, and each of the plurality of display pixels comprises at least one organic light-emitting diode, wherein the at least one organic light-emitting diode has a first end and a second end, and at least one of the first end and the second end is formed by one of the plurality of display electrodes, the touch control method comprising:
providing a first driving signal to at least one of the one or more first touch sensor electrodes of each touch sensor unit, the at least one of the one or more first touch sensor electrodes is configured to serve as a transmitting electrode during a touch sensing period; and setting at least one of the one or more display electrodes in a state capable of reducing effect of parasitic capacitances between a currently-driven-for-sensing touch sensor unit and the at least one of the one or more display electrodes.

33. The touch control method of claim 32, wherein each of the one or more display electrodes of the display unit corresponding to the currently-driven-for-sensing touch sensor unit is set in a state capable of reducing effect of parasitic capacitances between the currently-driven-for-sensing touch sensor unit and the corresponding display unit.

34. The touch control method of claim 32, wherein each of the one or more display electrodes of the display unit corresponding to the currently-driven-for-sensing touch sensor unit is set in a synchronization state to receive a synchronization signal during the touch sensing period, wherein a voltage difference between the synchronization signal and the first driving signal is substantially constant.

35. The touch control method of claim 34, wherein each of the one or more display electrodes of the display unit corresponding to at least one currently-not-driven-for-sensing touch sensor unit is set in the synchronization state.

36. The touch control method of claim 32, wherein each of the one or more display electrodes of the display unit corresponding to the currently-driven-for-sensing touch sensor unit is set in a floating state during the touch sensing period.

37. The touch control method of claim 36, wherein each of the one or more display electrodes of the display unit corresponding to at least one currently-not-driven-for-sensing touch sensor unit is set in the floating state.

38. A touch display panel, comprising:
a substrate;
a first touch sensor layer, disposed on the substrate and patternized into a plurality of blocks for serving as a plurality of first touch sensor electrodes, wherein the first touch sensor electrodes are grouped into a plurality of touch sensor units, each touch sensor unit comprises one or more first touch sensor electrodes, and at least one of the one or more first touch sensor electrodes of each touch sensor unit is configured to serve as a transmitting electrode during a touch sensing period; and
a display electrode layer, disposed between the substrate and the first touch sensor layer,
wherein the touch display panel is a liquid crystal display (LCD) panel further comprising a plurality of LCD common electrodes, and the display electrode layer is patternized into the plurality of LCD common electrodes for serving as a plurality of display electrodes and not for serving as touch sensor electrodes,
wherein the plurality of LCD common electrodes are grouped into a plurality of display units, and each display unit having one or more LCD common electrodes is respectively corresponding to a touch sensor unit of the plurality of touch sensor units.

* * * * *